United States Patent
Lii et al.

(10) Patent No.: US 9,305,890 B2
(45) Date of Patent: Apr. 5, 2016

(54) PACKAGE HAVING SUBSTRATE WITH EMBEDDED METAL TRACE OVERLAPPED BY LANDING PAD

(71) Applicant: Taiwan Semiconductor Manufacturing Company, Ltd., Hsin-Chu (TW)

(72) Inventors: Mirng-Ji Lii, Sinpu Township (TW); Yu-Min Liang, Zhongli (TW); Yu-Feng Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 2 days.

(21) Appl. No.: 14/155,949

(22) Filed: Jan. 15, 2014

(65) Prior Publication Data

US 2015/0200172 A1    Jul. 16, 2015

(51) Int. Cl.
*H01L 23/488* (2006.01)
*H01L 23/00* (2006.01)

(52) U.S. Cl.
CPC .............. *H01L 24/08* (2013.01); *H01L 24/03* (2013.01); *H01L 2224/03914* (2013.01); *H01L 2224/0805* (2013.01); *H01L 2224/08112* (2013.01); *H01L 2924/181* (2013.01)

(58) Field of Classification Search
CPC ................. H01L 23/49811; H01L 23/49816; H01L 23/49844; H01L 24/13; H01L 24/16; H01L 24/17

USPC ............................ 257/737, 738; 438/107–109
See application file for complete search history.

(56) References Cited

U.S. PATENT DOCUMENTS

| | | | |
|---|---|---|---|
| 5,892,277 A | 4/1999 | Ikemizu et al. | |
| 6,087,251 A | 7/2000 | Hsu | |
| 6,348,398 B1 | 2/2002 | Wang | |
| 6,352,916 B1 | 3/2002 | Tang et al. | |
| 6,388,322 B1 * | 5/2002 | Goossen et al. | 257/737 |
| 6,465,886 B1 | 10/2002 | Horiuchi et al. | |
| 6,627,824 B1 * | 9/2003 | Lin | 174/268 |
| 6,797,615 B1 | 9/2004 | Lous et al. | |
| 7,112,524 B2 | 9/2006 | Hsu et al. | |
| 8,318,537 B2 | 11/2012 | Pendse | |
| 8,952,538 B2 | 2/2015 | Matsuki | |
| 2002/0048944 A1 | 4/2002 | Tang et al. | |
| 2002/0187585 A1 | 12/2002 | Tsukada et al. | |
| 2009/0121349 A1 | 5/2009 | Suzuki | |
| 2011/0133334 A1 | 6/2011 | Pendse | |
| 2011/0217842 A1 | 9/2011 | Park et al. | |
| 2012/0098120 A1 | 4/2012 | Yu et al. | |
| 2012/0175774 A1 | 7/2012 | West et al. | |
| 2014/0035095 A1 * | 2/2014 | Lin et al. | 257/528 |
| 2014/0151867 A1 | 6/2014 | Lin et al. | |

* cited by examiner

*Primary Examiner* — Daniel Shook
(74) *Attorney, Agent, or Firm* — Slater & Matsil, L.L.P.

(57) ABSTRACT

An embodiment package includes a conductive pillar mounted on an integrated circuit chip, the conductive pillar having a stepper shape, a metal trace partially embedded in a substrate, the metal trace having a bonding pad portion protruding from the substrate, and a solder feature electrically coupling the conductive pillar to the bonding pad portion of the metal trace.

20 Claims, 11 Drawing Sheets

US 9,305,890 B2

PACKAGE HAVING SUBSTRATE WITH EMBEDDED METAL TRACE OVERLAPPED BY LANDING PAD

BACKGROUND

In a package such as a flip chip Chip Scale Package (fcCSP), an integrated circuit (IC) may be mounted to a substrate (e.g., a printed circuit board (PCB) or other integrated circuit carrier) through a bump on trace (BOT) interconnection.

In light of the demand for ever smaller packages, attempts are often made to reduce the distance between adjacent bumps, which is known as the bump pitch. One way to reduce the bump pitch is by shrinking the width of the metal traces used in the BOT interconnection. Unfortunately, reducing the width of the metal traces may lead to undesirable or detrimental consequences.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the disclosure provides many applicable inventive concepts that can be embodied in a wide variety of specific contexts. The specific embodiments discussed are merely illustrative and do not limit the scope of the disclosure.

The present disclosure will be described with respect to embodiments in a specific context, namely a package incorporating a bump on trace (BOT) interconnection. The concepts in the disclosure may also apply, however, to other packages, interconnection assemblies, or semiconductor structures.

Figure 1:
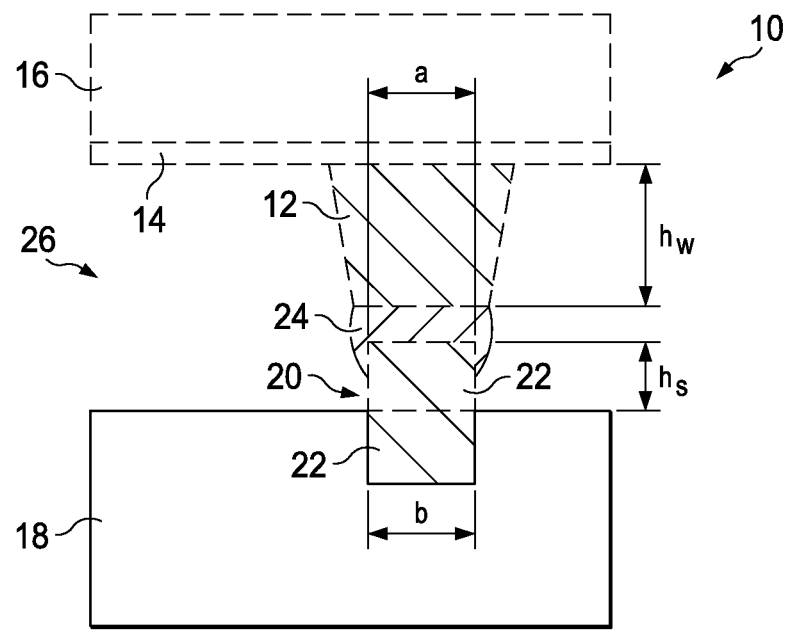
FIG. 1 illustrates a cross section of an embodiment package having a stepper-shaped conductive pillar and a partially embedded metal trace providing a protruding bonding pad portion.

Referring now to FIG. 1, an embodiment package 10 is illustrated. As will be more fully explained below, the geometry of the conductive pillar 12 prevents or inhibits delamination of the conductive pillar 12 from the dielectric layer within the device layer 14 of the integrated circuit chip 16 due to, for example, a coefficient of thermal expansion (CTE) mismatch between the chip 16 and the substrate 18.

In addition, the geometry of the bonding pad portion 20 of the metal trace 22 inhibits or prevents undesirable bridging of the solder feature 24 between adjacent traces, cold joining between the conductive pillar 12 and the metal trace 22, and peeling of the metal trace 22 from the substrate 18.

Figure 1A:
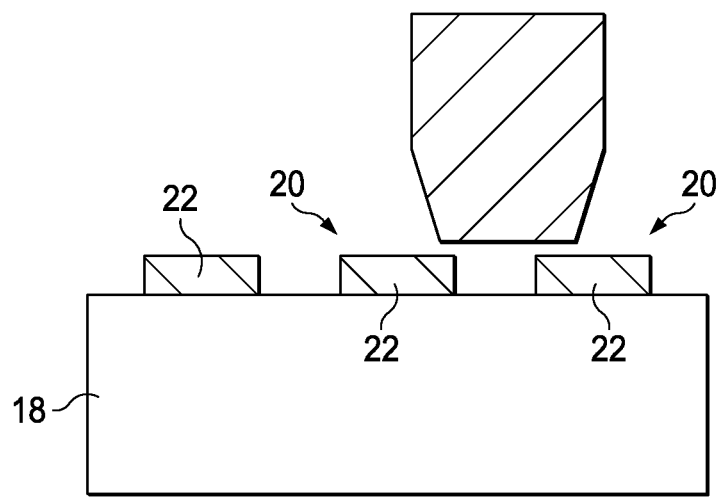
FIGS. 1A-1B illustrate a cross section of conventional probe testing configurations.
Figure 1B:
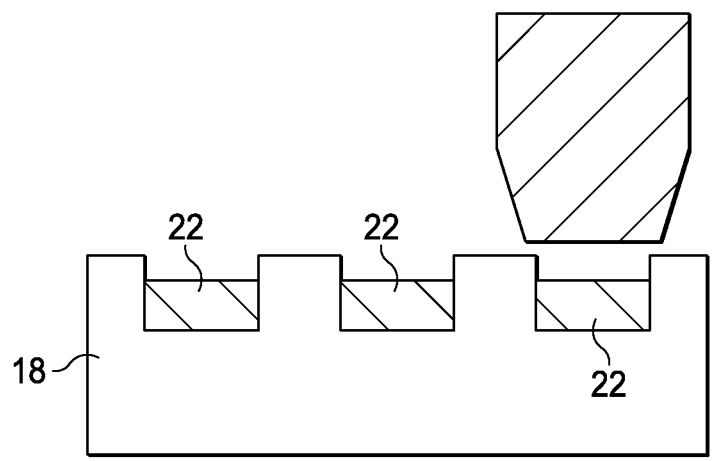
Figure 1C:
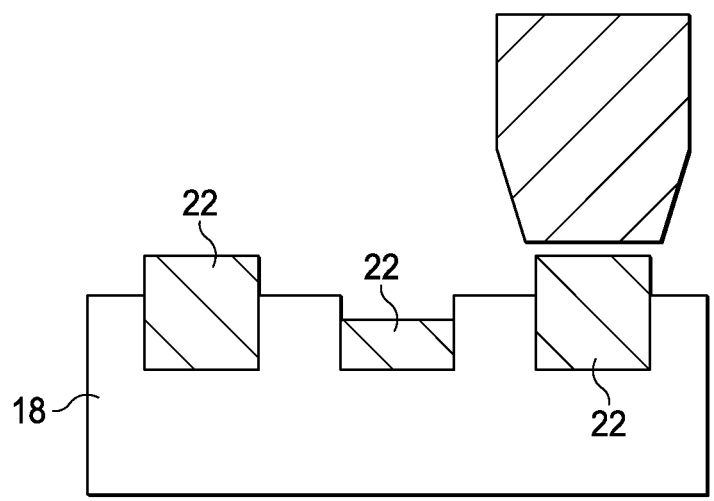
FIG. 1C illustrates a cross section of an embodiment probe testing configuration.

The configuration of the conductive pillar 12 and/or the metal trace 22 in FIG. 1 also ensures a sufficient stand-off distance between the integrated circuit chip 16 and the substrate 18 for the introduction of underfill or molding compound 26 as the bump pitch shrinks. The configuration of also provides enough space to permit testing of the bump-on-trace connection using, for example, probes or other testing equipment. Indeed, as shown in FIGS. 1A-1B, testing difficulties may be experienced in conventional testing configurations. In FIG. 1A, a false alarm indicating a short may be triggered when the probe pin inadvertently contacts the bonding pad portion 20 of both an intended trace 22 and an adjacent neighboring trace 22 if the bonding pad portions 20 of the traces 22 project above the top surface of the substrate 18. In FIG. 1B, it may be difficult for the probe pin to contact the traces 22 when all of the traces 22 are embedded in the substrate 18. In contrast, as shown in FIG. 1C, when the configuration of the traces 22 alternates such that one trace 22 includes a projecting bonding pad portion 20 and a neighboring trace 22 is embedded in the substrate 18 the difficulties or problems associated with FIGS. 1A-1B are overcome. In other words, using the orientation of FIG. 1C, the probing pitch is at least doubled.

As shown in FIG. 1, the embodiment package 10 includes the integrated circuit (IC) chip 16 (a.k.a., a die). In an embodiment, the integrated circuit chip 16 includes one or more device layers 14 with a dielectric material. The dielectric material may be, for example, an extremely low-k (ELK) dielectric. As used herein, ELK refers to a dielectric material having a dielectric constant of about 2.5 or less, and preferably between 1.9 and 2.5. The device layers 14 may include a single layer of the dielectric material or several layers of the dielectric material.

A conductive pillar 12 is mounted to the underside of the integrated circuit chip 16. In an embodiment, the conductive pillar 12 engages with or abuts against the dielectric material in the in the outermost device layer 14 of the integrated circuit chip 16. As shown, the conductive pillar 12 extends below or beneath the integrated circuit chip 16 after the chip has been flipped during the flip chip packaging process.

In an embodiment, the conductive pillar 12 has a stepper shape, which resembles an inverted truncated cone. Therefore, a diameter or width of the conductive pillar 12 diminishes as the conductive pillar extends away from the integrated circuit chip 16 and toward the substrate 18. In other words, the conductive pillar 12 tapers from bottom (near the IC 16) to top (near the solder feature 24) as oriented in FIG. 1.

While the conductive pillar 12 in FIG. 1 is depicted as having a linear taper, the conductive pillar 12 may have sidewalls that are curved, terraced, or otherwise configured and still be considered to have a stepper shape. In an embodiment, the conductive pillar 12 is formed from a suitable material such as, for example, copper (Cu), nickel (Ni), gold (Au), palladium (Pd), titanium (Ti), or alloys thereof.

Still referring to FIG. 1, the embodiment package 10 also includes a metal trace 22. In an embodiment, the metal trace 22 is formed from copper (Cu), nickel (Ni), gold (Au), aluminum (Al), silver (Ag), or alloys thereof. In an embodiment, the metal trace 22 is coated with a surface treatment such as, for example, organic solderability preservatives (OSP), immersion tin (IT), and so on.

The metal trace 22 is partially embedded in the substrate 18. Because the metal trace 22 is partially embedded, the metal trace 22 provides the bonding pad portion 20. As shown, the bonding pad portion 20 protrudes or projects from the underlying substrate 18. In other words, the bonding pad portion 20 is disposed above the top surface of the substrate 18 and is not encapsulated by the substrate 18.

In an embodiment, a top width a of the bonding pad portion 20 is equal to, or approximately equal to, a bottom width b of the bonding pad portion 20. In an embodiment, a bottom width b of the bonding pad portion 20 is greater than or equal to about 10 μm and less than or equal to about 25 μm. In an embodiment, a height $h_s$ (a.k.a., thickness) of the bonding pad portion 20 is greater than or equal to about 1 μm and less than or equal to about 20 μm. In an embodiment, a height $h_w$, of the conductive pillar 12 is greater than or equal to about 20 μm and less than about 50 μm.

The solder feature 24 (e.g., solder joint) electrically couples the conductive pillar 12 to the bonding pad portion 20 of the metal trace 22. In an embodiment, the solder feature 24 is a solder ball, solder paste, or another conductive component suitable for electrically coupling devices together. In an embodiment, the solder feature 24 is formed from a material that can be reflowed to electrically bond the devices together.

Figure 2:
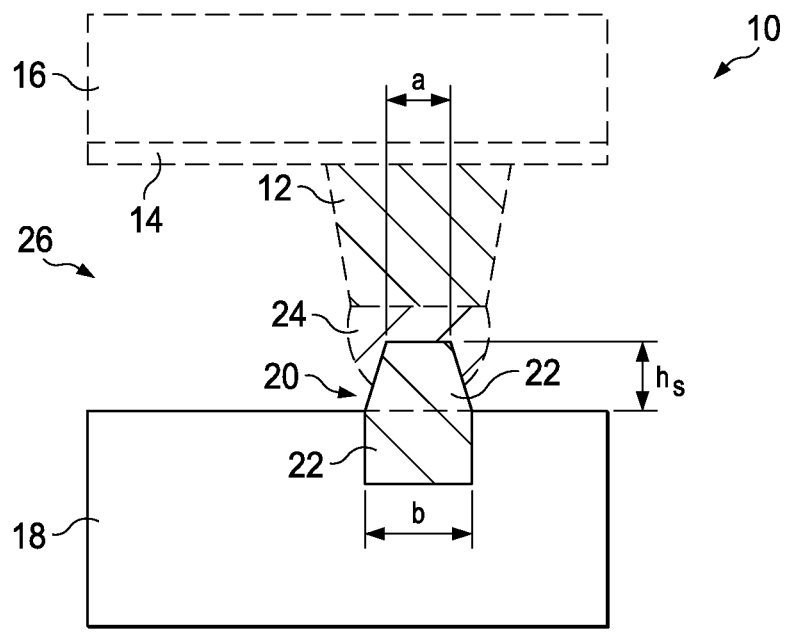
FIG. 2 illustrates a cross section of an embodiment package having a stepper-shaped conductive pillar and a partially embedded metal trace providing a stepper-shaped protruding bonding pad portion.

Referring now to FIG. 2, in an embodiment a bottom width b of the bonding pad portion 20 is greater than a top width a of the bonding pad portion 20. In this configuration, the bonding pad portion 20 has a stepper shape. In other words, a diameter of the bonding pad portion 20 tapers from bottom to top (i.e., a periphery of the bonding pad portion 20 gets smaller the farther away from the substrate 18 the bonding pad portion 20 projects).

In an embodiment, the bonding pad portion 20 utilizes the stepper shape shown in FIG. 2 the formula $b-a>0.36h_s-0.1$ μm is satisfied, where b is a bottom width of the bonding pad portion, a is a top width of the bonding pad portion, and $h_s$ is a height of the bonding pad portion.

Figure 3:
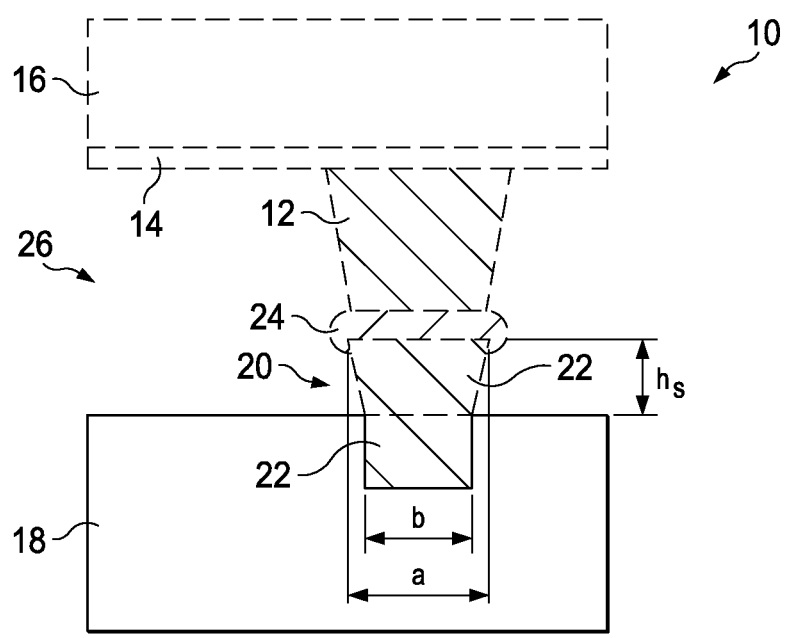
FIG. 3 illustrates a cross section of an embodiment package having a stepper-shaped conductive pillar and a partially embedded metal trace providing an inverted stepper-shaped protruding bonding pad portion.

Referring now to FIG. 3, in an embodiment a top width a of the bonding pad portion 20 is greater than a bottom width b of the bonding pad portion 20. In this configuration, the bonding pad portion 20 has an inverted stepper shape. Indeed, a diameter of the bonding pad portion 20 tapers from top to bottom. In other words, a diameter of the bonding pad portion 20 tapers from top to bottom (i.e., a periphery of the bonding pad portion 20 gets larger the farther away from the substrate 18 the bonding pad portion 20 projects).

In an embodiment, the bonding pad portion 20 utilizes an inverted stepper shape as shown in FIG. 3 when a formula $a-b>0.36h_s-0.1$ μm is satisfied, where a is a top width of the bonding pad portion, b is a bottom width of the bonding pad portion, and $h_s$ is a height of the bonding pad portion.

Figure 4:
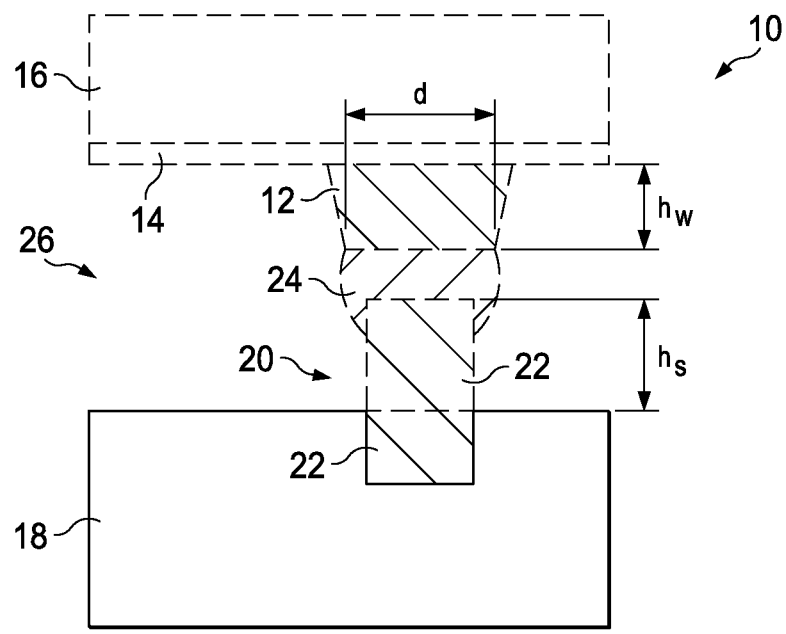
FIG. 4 illustrates an embodiment package with a partially embedded metal trace providing a longer protruding bonding pad portion.
Figure 5:
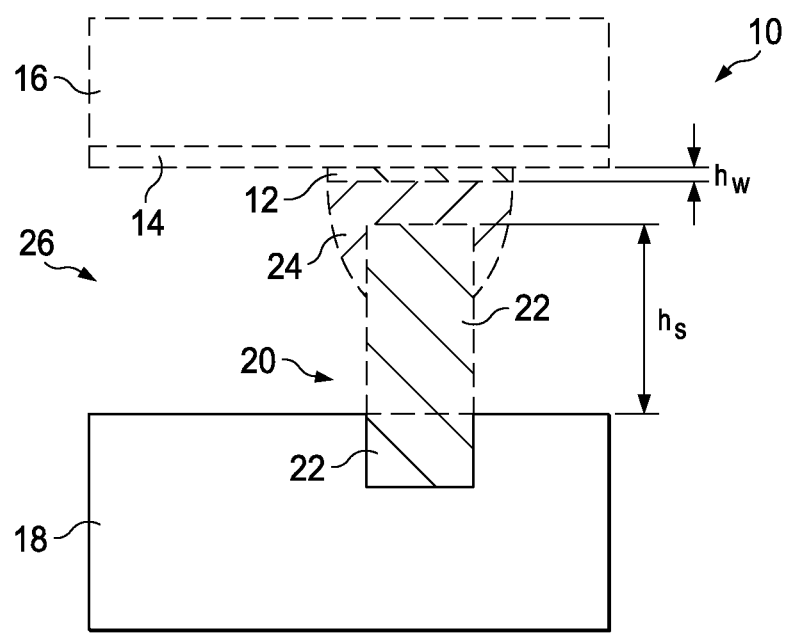
FIG. 5 illustrates an embodiment package with a partially embedded metal trace providing an even longer protruding bonding pad portion.

With regard to FIGS. 4-5, it was discovered that the height $h_w$ of the conductive pillar 12 had an effect on the ELK stress. Indeed, as the height $h_w$ of the conductive pillar 12 was reduced, the pillar dimension d became larger. Therefore, when the coefficient of thermal expansion (CTE) mismatch occurred, the solder feature 24 deformed to absorb a portion of the force. With a larger pillar dimension d, the amount of deformation is reduced at the sides of the conductive pillar 12 and increased at the sides of the protrusion bonding pad portion 20, which yielded a smaller stress to the ELK.

Unfortunately, the reduction in the height $h_w$ of the conductive pillar 12 noted above may reduce the stand-off height (i.e., the distance between the integrated circuit chip 16 and the substrate 18). When the stand-off height is reduced too much, the introduction of underfill or molding compound in that area may be negatively affected. For example, because of the small stand-off dimension voids may occur. Thus, there is the potential for failure of the device and reliability is diminished.

To resolve this issue experienced when the height $h_w$ of the conductive pillar 12 is reduced, a longer bonding pad portion 20 is proposed. As will be more fully explained below, the taller or thicker bonding pad portion 20 of the metal trace 22 maintains a sufficient stand-off dimension to ensure suitable and smooth flow of the underfill material or molding compound.

As shown in FIGS. 4-5, in an embodiment the height $h_s$ of the bonding pad portion 20 of the metal trace 22 is increased relative to the $h_s$ of the bonding pad portion 20 in some other embodiments. For example, the height $h_s$ of the bonding pad portion 20 may be greater than or equal to the height of the conductive pillar 12.

As shown in FIG. 4, in an embodiment the height $h_w$ of the conductive pillar 12 is greater than or equal to about 10 μm and less than or equal to about 30 μm when the height $h_s$ of the bonding pad portion 20 is greater than or equal to about 20 μm and less than or equal to about 40 μm.

As shown in FIG. 5, in an embodiment the height $h_w$ of the conductive pillar 12 is greater than or equal to about 1 μm and less than or equal to about 10 μm when the height $h_s$ of the bonding pad portion 20 is greater than or equal to about 20 μm and less than or equal to about 40 μm.

Figure 6A:
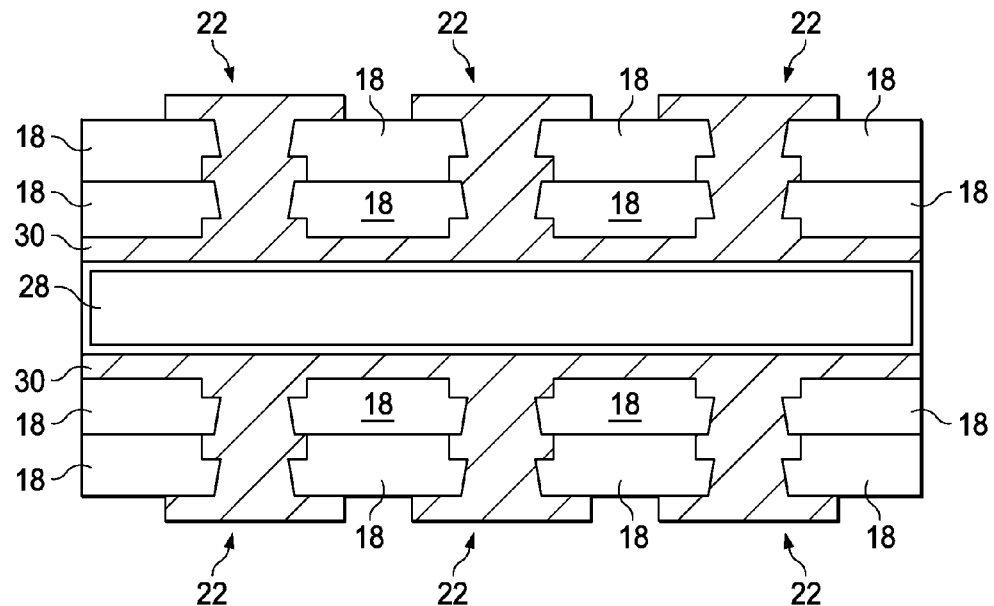
FIGS. 6A-6F collectively schematically illustrate a process of forming the embodiment packages of FIGS. 1-3.

FIGS. 6A-6F collectively schematically illustrate a process of forming the embodiment packages 10 of FIGS. 1-3. In FIG. 6A, a coreless build up process is implemented using a carrier 28. As shown, during the coreless build up process a metal material 30 (e.g., copper, etc.) is introduced into openings in the substrate 18 for the purpose of forming each metal trace 22.

Figure 6B:
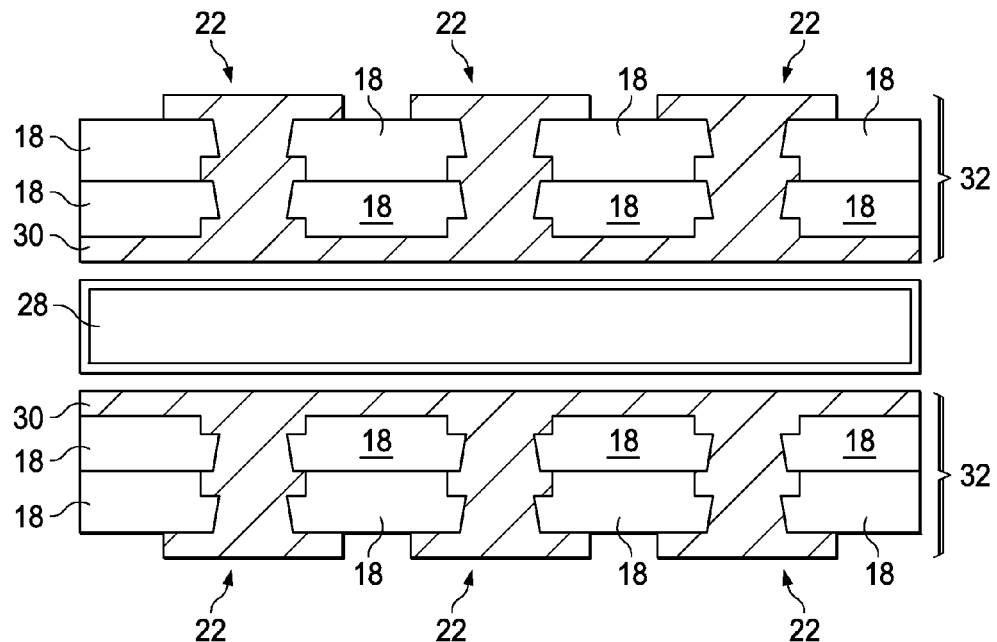
Figure 6C:
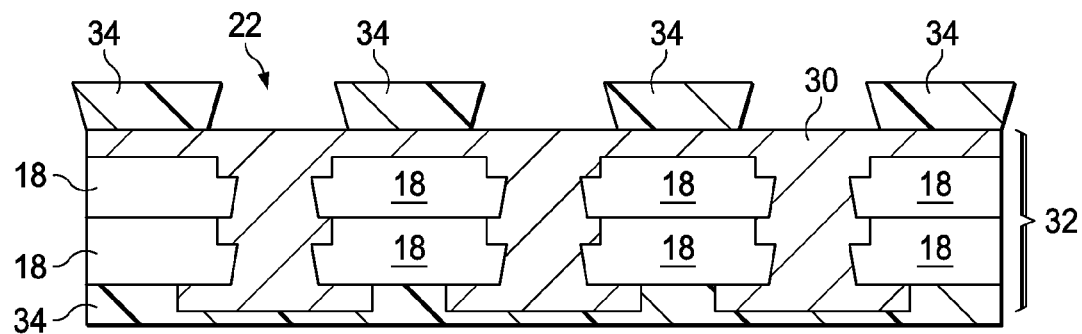

Once the metal material 30 has been suitably formed within the substrate 18, the protrusion pad structure 32 is separated or released from the carrier 28 as shown in FIG. 6B. Thereafter, in FIG. 6C, a photo resist (PR) 34 is formed over the metal material 30 and patterned. In an embodiment, the angle of the sidewalls of the photo resist 34 (highlighted by dashed lines and an arrow) is controlled by tuning the exposure and developing parameters during the photolithography process.

Figure 6D:
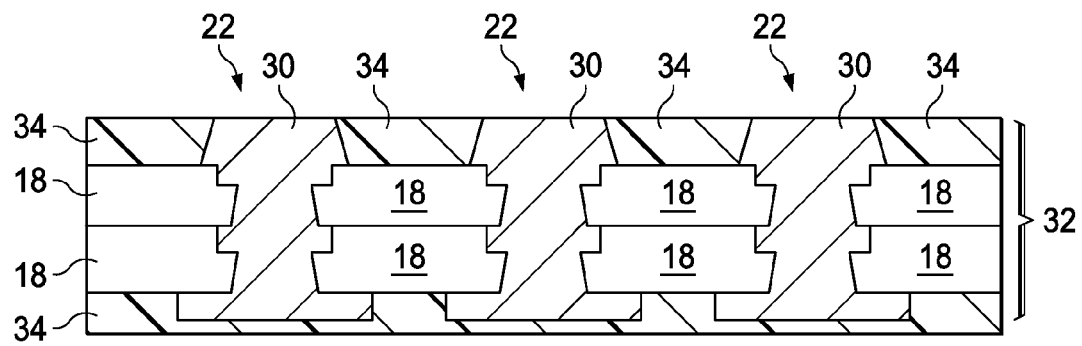

After the photo resist 34 has been patterned, a metal plating (e.g., copper plating) process is performed as shown in FIG. 6D. The plating process is performed to deposit or introduce the metal material 30 into the openings in the patterned photo resist 34. Once the photo resist 34 has been removed as shown in FIG. 6E, a metal etching process is performed to remove portions of the metal material 30 between the bonding pad portions 20 of the adjacent metal traces 22.

Figure 6E:
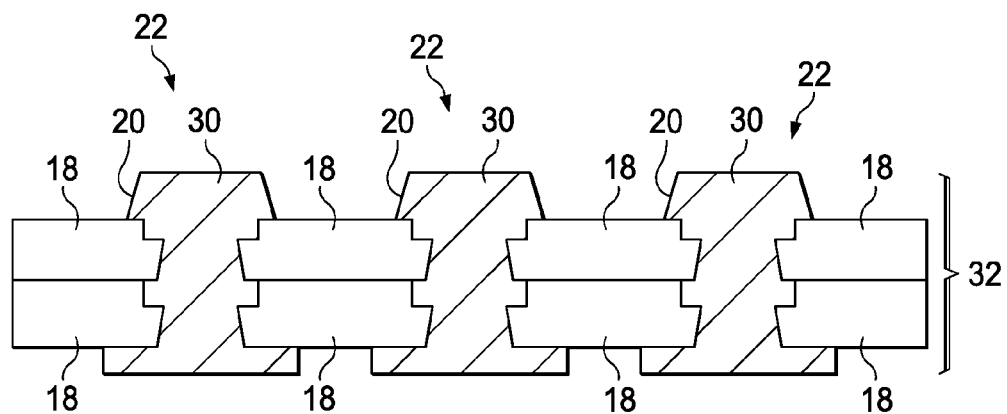

In the embodiment of FIG. 6E, the bonding pad portion 20 of the metal trace 22 has a stepper shape. In other words, the bonding pad portion 20 has a diminishing diameter as the bonding pad portion 20 projects away from the substrate 18.

Figure 6F:
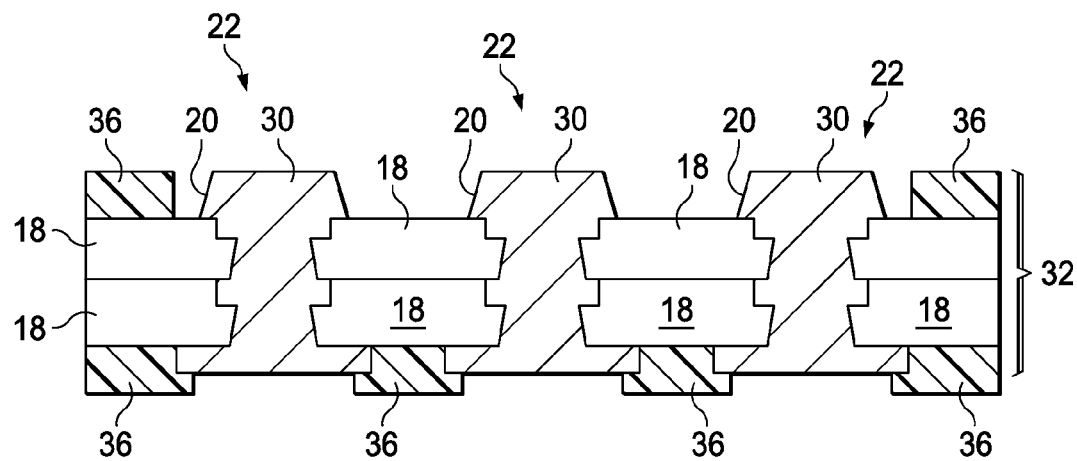

As shown in FIG. 6F, a solder resist coating 36 may be formed over portions of the substrate 18 prior to the bonding pad portion 20 of the metal trace 22 being used to form an electrical connection within the package 10. It should be recognized that additional processes may be performed during the fabrication of the package 10 of FIGS. 1-5 in practical applications.

Figure 7A:
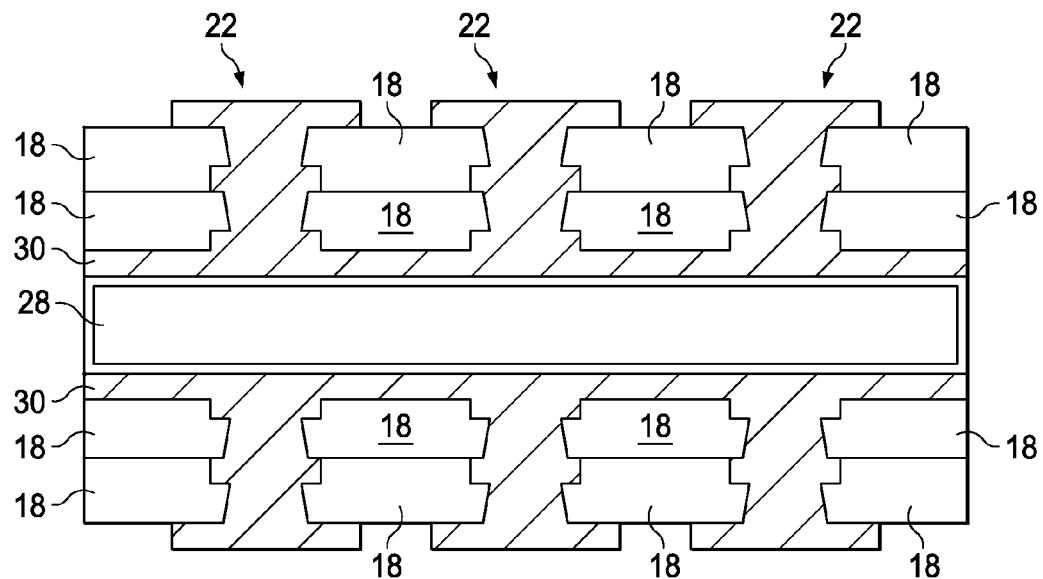
FIGS. 7A-7F collectively schematically illustrate a process of forming the embodiment packages of FIGS. 4-5.

FIGS. 7A-7F collectively schematically illustrate a process of forming the embodiment packages of FIGS. 4-5. In FIG. 7A, the coreless build up process is implemented using the carrier 28. As shown, during the coreless build up process the metal material 30 (e.g., copper, etc.) is introduced into openings in the substrate 18 for the purpose of forming the metal trace 22.

Figure 7B:
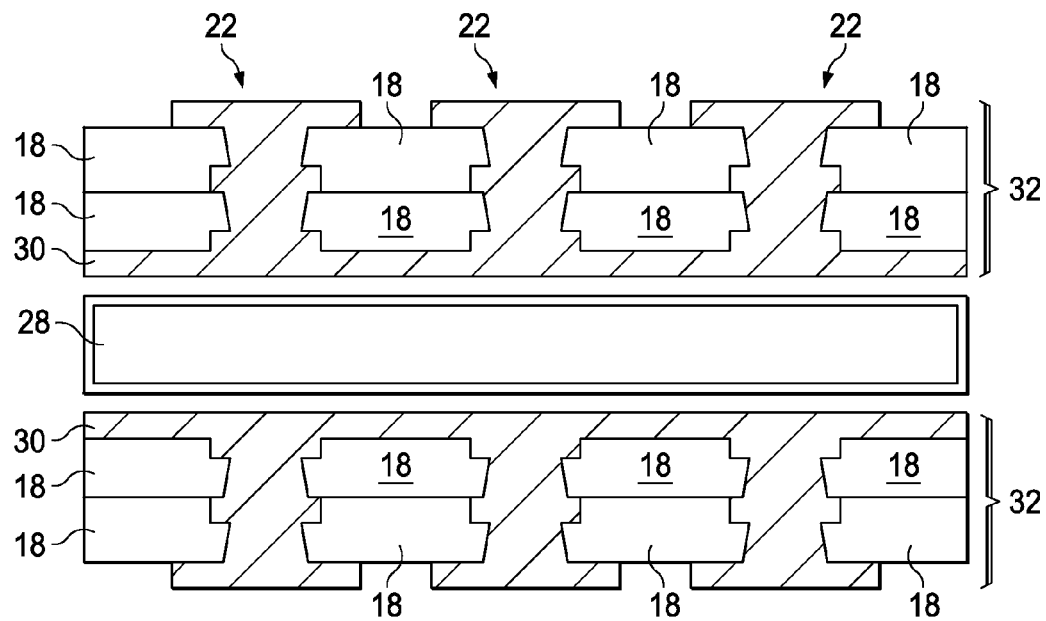
Figure 7C:
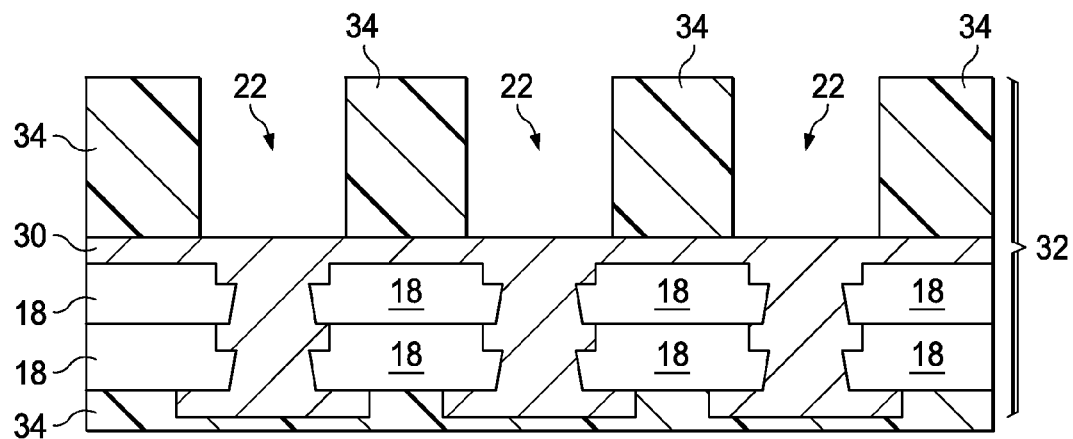

Once the metal material 30 has been suitably formed within the substrate 18, the protrusion pad structure 32 is separated or released from the carrier 28 as shown in FIG. 7B. Thereafter, in FIG. 7C, a photo resist (PR) 34 is formed over the metal material 30 and patterned. In an embodiment, the thickness of the photo resist 34 in FIG. 7C is much greater than, for example, the thickness of the photo resist 34 in FIG. 6C. In addition, in an embodiment the sidewalls of the photo resist 34 are vertically-oriented (i.e., make a right angle with the top surface of the metal material 30).

Figure 7D:
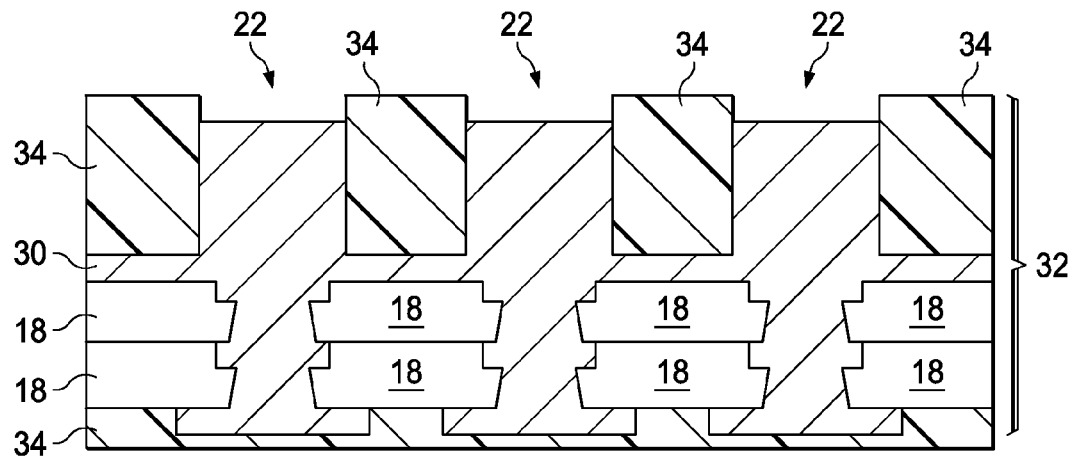

After the photo resist 34 has been patterned, a metal plating (e.g., copper plating) process is performed as shown in FIG. 7D. The plating process is performed to deposit or introduce the metal material 30 into the openings in the patterned photo resist 34. Once the photo resist 34 has been removed as shown in FIG. 7E, a metal etching process is performed to remove portions of the metal material 30 between the bonding pad portions 20 of the adjacent metal traces 22.

Figure 7E:
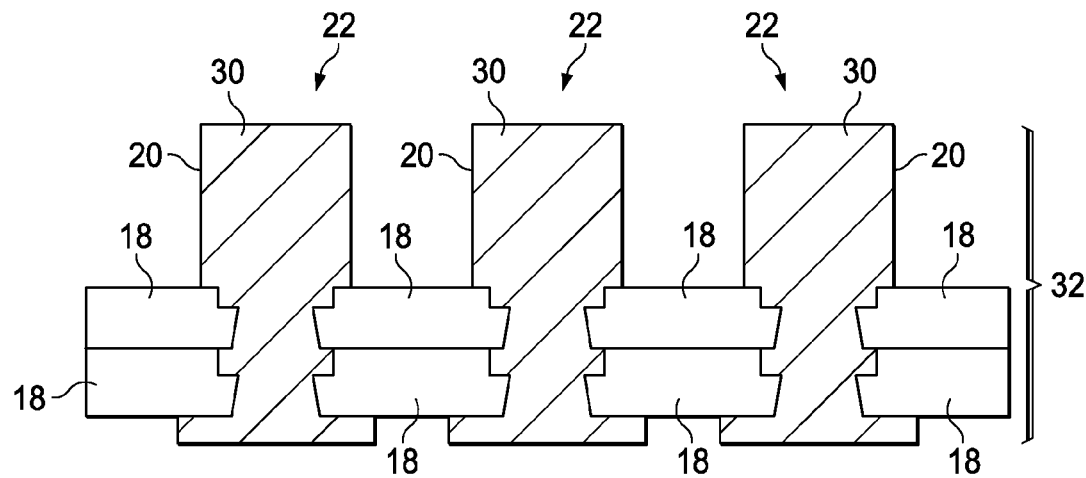
Figure 7F:
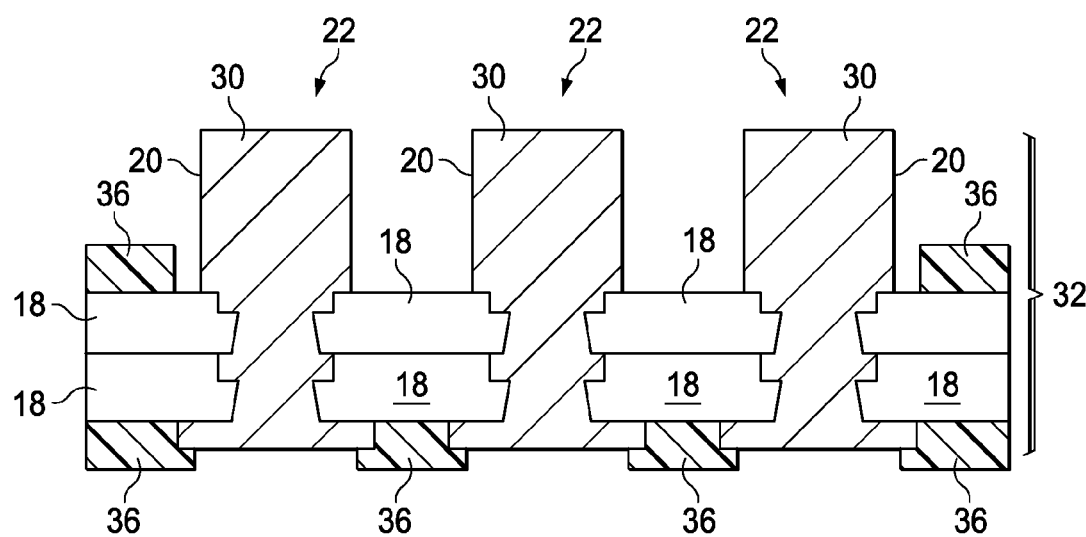

In the embodiment of FIG. 7E, the bonding pad portion 20 of the metal trace 22 has a rectangular shape. In other words, the bonding pad portion 20 has a relatively constant diameter as the bonding pad portion 20 projects away from the substrate 18. In addition, the bonding pad portion 20 in FIG. 7E is substantially taller (or thicker) than the bonding pad portion 20 depicted in FIG. 6E. Therefore, the bonding pad portion 20 in FIG. 7E may be referred to as a long bonding pad portion 20.

As shown in FIG. 6F, a solder resist coating 36 may be formed over portions of the substrate 18 prior to the bonding pad portion 20 of the metal trace 22 being used to form an electrical connection within the package 10. It should be recognized that additional processes may be performed during the fabrication of the package 10 of FIGS. 1-5 in practical applications.

From the foregoing it should be recognized that the embodiment packages disclosed herein provide advantageous benefits and features. For example, the geometry of the conductive pillar 12 prevents or inhibits delamination of the conductive pillar 12 from the extremely low-k dielectric layer of the chip 16 due to, for example, a coefficient of thermal expansion (CTE) mismatch between the chip 16 and the substrate 18. In addition, the geometry of the protruding bonding pad portion 20 of the metal trace 22 inhibits or prevents undesirable bridging of the solder feature 24 between adjacent traces, cold joining between the conductive pillar 12 and the metal trace 22, and peeling of the metal trace 22 from the substrate 18.

Figure 8A:
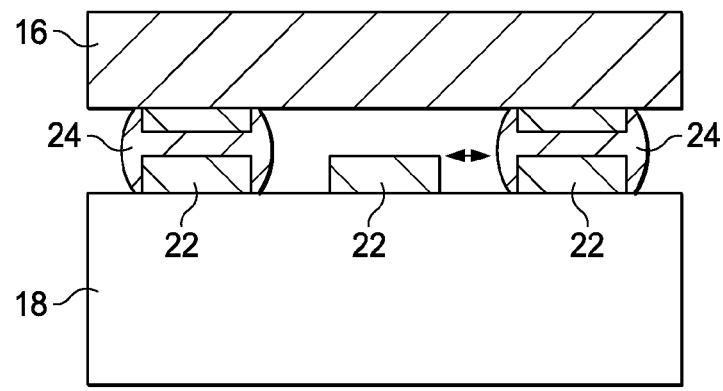
FIGS. 8A-8B illustrate a cross section of conventional packages.
Figure 8B:
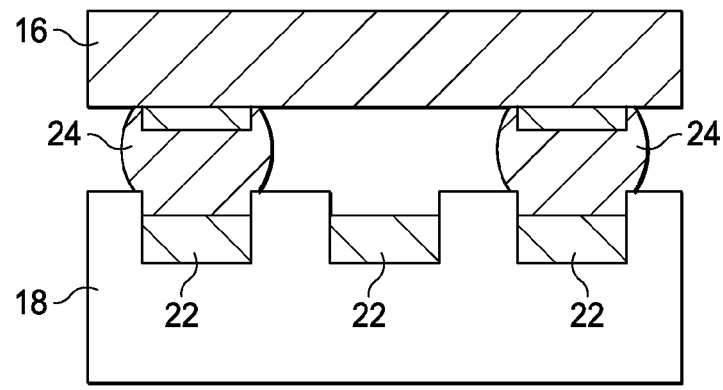
Figure 8C:
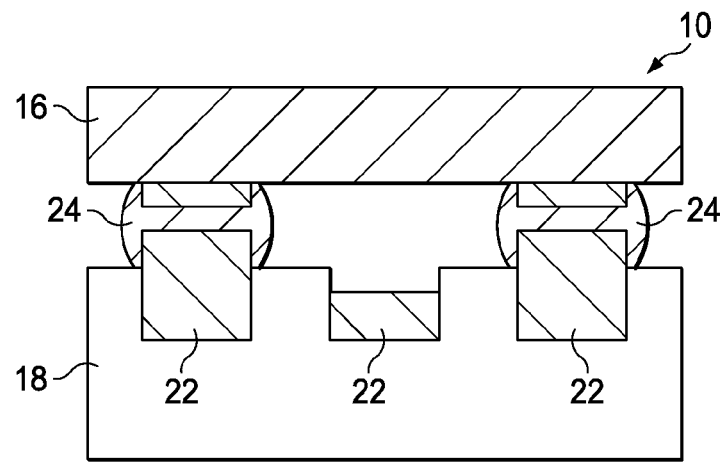
FIG. 8C illustrates a cross section of an embodiment package using both projecting and embedded traces.

As shown in FIG. 8A, in conventional configurations a short may occur due to the small pitch between adjacent traces (represented by the arrow between the adjacent traces). As shown in FIG. 8B, in conventional configurations an open circuit may occur unless the bump and the trace in the cavity of the substrate 18 are very accurately aligned. In contrast, where the traces 22 alternate (e.g., one trace 22 projects from the substrate 18 and the neighboring trace 22 is embedded in the substrate 18), both the short window and the open window are improved as shown in FIG. 8C. Indeed, where the passing line or trace 22 is recessed between the bump structures utilizing protruding traces 22 the assembly process for the embodiment package 10 is improved.

An embodiment package includes a conductive pillar mounted on an integrated circuit chip, the conductive pillar having a stepper shape, a metal trace partially embedded in a substrate, the metal trace having a bonding pad portion protruding from the substrate, and a solder feature electrically coupling the conductive pillar to the bonding pad portion of the metal trace.

An embodiment package includes a conductive pillar mounted on an integrated circuit chip, the conductive pillar having a stepper shape and defining a conductive pillar height, a metal trace partially embedded in a substrate, the metal trace having a bonding pad portion protruding from the substrate, the bonding pad portion defining a bonding pad portion height, the bonding pad portion height greater than or equal to the conductive pillar height, and a solder feature electrically coupling the conductive pillar to the bonding pad portion of the metal trace.

An embodiment method of forming a package includes mounting a conductive pillar having a stepper shape to an integrated circuit chip, partially embedding a metal trace in a substrate, the metal trace having a bonding pad portion protruding from the substrate, and electrically coupling the conductive pillar to the bonding pad portion of the metal trace.

While the disclosure provides illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. A package, comprising:
    a conductive pillar mounted on an integrated circuit chip, the conductive pillar having a stepper shape;
    a metal trace partially embedded in a substrate, the metal trace having a bonding pad portion and a recessed portion, the bonding pad portion protruding from the substrate, the recessed portion having a top surface lower than an uppermost surface of the substrate such that the substrate extends below the recessed portion and extends above the recessed portion, wherein an upper surface of the recessed portion is free of the substrate; and
    a solder feature electrically coupling the conductive pillar to the bonding pad portion of the metal trace.

2. The package of claim 1, wherein the bonding pad portion has a stepper shape.

3. The package of claim 1, wherein the bonding pad portion has an inverted stepper shape.

4. The package of claim 1, wherein a diameter of the bonding pad portion tapers from top to bottom.

5. The package of claim 1, wherein a diameter of the bonding pad portion tapers from bottom to top.

6. The package of claim 1, wherein a top width of the bonding pad portion is less than a bottom width of the bonding pad portion.

7. The package of claim 1, wherein a top width of the bonding pad portion is greater than a bottom width of the bonding pad portion.

8. The package of claim 1, wherein the bonding pad portion utilizes a stepper shape when a formula $b-a>0.36hs-0.1$ µm is satisfied, where b is a bottom width of the bonding pad portion, a is a top width of the bonding pad portion, and hs is a height of the bonding pad portion.

9. The package of claim 1, wherein the bonding pad portion utilizes an invertd stepper shape when a formula $a-b>0.36hs-0.1$ µm is satisfied, where a is a top width of the bonding pad portion, b is a bottom width of the bonding pad portion, and hs is a height of the bonding pad portion.

10. The package of claim 1, wherein a height of the bonding pad portion is greater than or equal to about 1 µm and less than about 20 µm when a height of the conductive pillar is greater than or equal to about 20 µm and less than about 50 µm.

11. The package of claim 1, wherein a bottom width of the bonding pad portion is greater than or equal to about 10 µm and less than or equal to about 25 µm.

12. The package of claim 1, wherein a height of the bonding pad portion is greater than or equal to about 10 µm and less than or equal to about 20 µm.

13. A package, comprising:
a conductive pillar mounted on an integrated circuit chip, the conductive pillar having a stepper shape and defining a conductive pillar height;
a metal trace partially embedded in a substrate, the metal trace having a bonding pad portion protruding from the substrate and a recessed portion recessed from an outermost surface of the substrate, an entirety of the metal trace facing the integrated circuit chip being free of the substrate, the bonding pad portion defining a bonding pad portion height, the bonding pad portion height greater than or equal to the conductive pillar height;
a solder feature electrically coupling the conductive pillar to the bonding pad portion of the metal trace;
a neighboring metal trace embedded in the substrate and adjacent to the metal trace, a top surface of a portion of the neighboring metal trace disposed beneath an uppermost surface of the substrate; and
an underfill interposed between the integrated circuit chip and the substrate, the underfill contacting surfaces of the neighboring metal trace and the recessed portion.

14. The package of claim 13, wherein the conductive pillar height is greater than or equal to about 1 µm and less than or equal to about 10 µm when the bonding pad portion height is greater than or equal to about 20 µm and less than or equal to about 40 µm.

15. The package of claim 13, wherein the conductive pillar height is greater than or equal to about 10 µm and less than or equal to about 30 µm when the bonding pad portion height is greater than or equal to about 20 µm and less than or equal to about 40 µm.

16. The package of claim 13, wherein the integrated circuit chip includes a device layer with an extremely low-k (ELK) dielectric layer abutting the conductive pillar.

17. The package of claim 13, wherein an underfill material is disposed around the conductive pillar and the bonding pad portion of the metal trace and between the integrated circuit chip and the substrate.

18. A method of forming a package, comprising:
mounting a conductive pillar having a stepper shape to an integrated circuit chip;
partially embedding a metal trace in a substrate, the metal trace having a bonding pad portion protruding from the substrate and a recessed portion;
partially embedding a neighboring metal trace in the substance adjacent to the metal trace, a top surface of a portion of the neighboring metal trace closest to the bonding pad portion being disposed beneath an uppermost surface of the substrate; and
electrically coupling the conductive pillar to the bonding pad portion of the metal trace, wherein a surface of the substrate is closer to the integrated circuit chip than a surface of the recessed portion, the surface of the recessed portion being free of the substrate.

19. The method of claim 18, further comprising forming the bonding pad portion such that the bonding pad portion has a stepper shape.

20. The method of claim 18, further comprising forming the bonding pad portion such that the bonding pad portion has an inverted stepper shape.

* * * * *

UNITED STATES PATENT AND TRADEMARK OFFICE
CERTIFICATE OF CORRECTION

PATENT NO. : 9,305,890 B2
APPLICATION NO. : 14/155949
DATED : April 5, 2016
INVENTOR(S) : Mirng-Ji Lii It is certified that error appears in the above-identified patent and that said Letters Patent is hereby corrected as shown below:

In the Claims

In Col. 8, lines 26 and 27, claim 18, delete "substance" and insert --substrate--.

Signed and Sealed this
Seventh Day of June, 2016

Michelle K. Lee
*Director of the United States Patent and Trademark Office*